US009345166B2

(12) United States Patent
Rubenstein

(10) Patent No.: US 9,345,166 B2
(45) Date of Patent: May 17, 2016

(54) RACKLESS COMPUTING EQUIPMENT CONSTRUCTION

(71) Applicant: Microsoft Corporation, Redmond, WA (US)

(72) Inventor: Brandon Aaron Rubenstein, Lynnwood, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 141 days.

(21) Appl. No.: 14/143,251

(22) Filed: Dec. 30, 2013

(65) Prior Publication Data

US 2015/0189786 A1 Jul. 2, 2015

(51) Int. Cl.
| | |
|---|---|
| *H05K 7/18* | (2006.01) |
| *G06F 1/16* | (2006.01) |
| *H05K 7/14* | (2006.01) |
| *G06F 1/18* | (2006.01) |

(52) U.S. Cl.
CPC .............. *H05K 7/1489* (2013.01); *G06F 1/181* (2013.01)

(58) Field of Classification Search
None
See application file for complete search history.

(56) References Cited

U.S. PATENT DOCUMENTS

| | | | |
|---|---|---|---|
| 4,202,586 A | 5/1980 | Oplinger | |
| 5,142,445 A | 8/1992 | Sorensen et al. | |
| 5,940,274 A * | 8/1999 | Sato et al. | 361/725 |
| 6,148,352 A * | 11/2000 | Coale et al. | 710/100 |
| 6,654,241 B2 | 11/2003 | Hillyard et al. | |
| 6,698,851 B1 * | 3/2004 | Ludl | 312/108 |
| 6,749,070 B2 * | 6/2004 | Corbett et al. | 211/26 |
| 7,134,673 B2 * | 11/2006 | Ferraro et al. | 280/33.991 |
| 7,239,509 B1 | 7/2007 | Roeske | |
| 7,821,790 B2 | 10/2010 | Sharma et al. | |

(Continued)

FOREIGN PATENT DOCUMENTS

JP 2008009648 A 1/2008

OTHER PUBLICATIONS

"SOHO Knockdown Desk Rack Cabinets Server, Storage & Networking (RCSC Series)", Published on: May 12, 2008, Available at: http://www.hammondmfg.com/rackRCSC.htm.

(Continued)

*Primary Examiner* — Hoa C Nguyen
*Assistant Examiner* — Xanthia C Cunningham
(74) *Attorney, Agent, or Firm* — Henry Gabryjelski; Kate Drakos; Micky Minhas

(57) ABSTRACT

A self-supporting server chassis accepts blade server computing devices, and other like computing devices and associated infrastructure hardware, and also provides structural support for vertical stacking of such self-supporting server chassis, thereby eliminating the need for conventional racks. Internal support structures, such as rails, holes and standoffs, accept and provide physical support for the computing devices and other infrastructure hardware. Vertical stacking support structures provide physical stability and rigidity for stacking multiple self-supporting server chassis in a vertical direction, and allow interconnection among self-supporting server chassis. Stacks of self-supporting server chassis can comprise a base member with casters or other like transportation hardware, as well as a top member that provides further structural stability and rigidity, as well as providing cooling and airflow benefits, such as airflow containment. Ranking hardware in the self-supporting server chassis accommodates computing devices and infrastructure hardware that were designed for installation into a traditional rack.

20 Claims, 4 Drawing Sheets

(56) References Cited

U.S. PATENT DOCUMENTS

| | | | |
|---|---|---|---|
| 2002/0008961 A1* | 1/2002 | Amaike et al. | 361/687 |
| 2002/0058445 A1 | 5/2002 | Tamura et al. | |
| 2002/0125799 A1* | 9/2002 | Landsberger et al. | 312/209 |
| 2003/0007321 A1* | 1/2003 | Dayley | 361/683 |
| 2003/0016515 A1 | 1/2003 | Jackson et al. | |
| 2007/0115627 A1* | 5/2007 | Carlisi et al. | 361/686 |
| 2008/0266813 A1 | 10/2008 | Carlisi et al. | |
| 2010/0265657 A1* | 10/2010 | Chen et al. | 361/679.58 |
| 2010/0321874 A1 | 12/2010 | Bhattacharyya et al. | |

OTHER PUBLICATIONS

"Overview of the HP 9000 rp3410-2, rp3440-4, rp4410-4, and rp4440-8 Servers", A Technical White Paper of HP, Apr. 21, 2005, 31 pages.

"International Search Report & Written Opinion Issued in PCT Application No. PCT/US2014/071776", Mailed Date: Mar. 31, 2015, 11 Pages.

* cited by examiner

RACKLESS COMPUTING EQUIPMENT CONSTRUCTION

BACKGROUND

The throughput of communications between computing devices continues to increase as modern networking hardware enables physically separate computing devices to communicate with one another orders of magnitude faster than was previously possible. Furthermore, high-speed network communication capabilities are being made available to a greater number of people, both in the locations where people work, and in their homes. As a result, an increasing amount of data and services can be meaningfully provided to an increasing audience via such network communications. In particular, it has become more practical to perform digital data processing at a location remote from the location where such data is initially generated, and where the processed data will be consumed. For example, a user can upload a digital photograph to a server and then cause the server to process the digital photograph, changing its colors and applying other visual edits to it. In such an example, the digital processing, such as of the photograph, is being performed by a device that is remote from the user. In another, more common, example, users utilize services and functionality that are conceptually simple, such as search services, but which, in fact, require vast amounts of processing capability.

To provide such data and processing capabilities, via network communications, from a centralized location, the centralized location typically comprises hundreds or thousands of computing devices, typically mounted in vertically oriented racks. Such a collection of computing devices, as well as the associated hardware necessary to support such computing devices, and the physical structure that houses the computing devices and associated hardware, is traditionally referred to as a "data center". With the increasing availability of high-speed network communication capabilities, and thus the increasing provision of data and services from centralized locations, as well as the traditional utilization of data centers, such as the provision of advanced computing services and massive amounts of computing processing capability, the size and quantity of data centers continues to increase.

Typically, the computing devices that perform the vast majority of the processing performed by a data center are commonly referred to as "blade server computing devices". To reduce cost and complexity such blade server computing devices typically comprise processing hardware, such as the central processing units and associated support processing units, but typically do not comprise infrastructure hardware, such as fans, power supplies, and the like. Instead, blade server computing devices are typically designed and constructed to plug into a larger physical device that is commonly referred to as a "server chassis". Such a server chassis typically provides physical receptacles into which blade server computing devices can be physically inserted and, thus, communicationally coupled to the infrastructure provided by the server chassis. Typically, a server chassis can accept several blade server computing devices, and can also comprise a power supply and fans, as well as a backplane logic board, or other like device, into which the blade server computing devices can physically and communicationally couple. Such a server chassis is then, typically, further mounted onto a physical rack that is typically oriented vertically in order to provide for multiple vertical layers of computing devices, such as the server chassis. The physical rack provides the physical stability and support in order to accommodate multiple vertical layers of computing devices and, thereby, enable data center operators to most efficiently utilize all three dimensions of space within a data center.

SUMMARY

In one embodiment, a self-supporting server chassis can accept blade server computing devices and other computing devices and infrastructure hardware relevant to the operation of a data center, as well as comprising support members by which multiple such self-supporting server chassis can be stacked vertically, thereby eliminating the need for separate racks and racking hardware.

In another embodiment, a self-supporting server chassis can comprise internal support structures that can accept and provide physical support for the computing devices and other infrastructure hardware that can be installed in such a self-supporting server chassis. The self-supporting server chassis can comprise rails for accepting blade server computing devices, holes to provide for fan-assisted airflow, standoffs with screw holes or other like attachment members providing attachment support for fans, power supplies, backplanes and the like, and other like internal support structures.

In yet another embodiment, a self-supporting server chassis can comprise vertical stacking support structures that can provide physical stability and rigidity for stacking multiple self-supporting server chassis in a vertical direction, as well as providing physical mechanisms by which such vertically stacked self-supporting server chassis can be physically interconnected and interlocked for additional stability and rigidity. The vertical stacking support structures can be internal to the self-supporting server chassis, or they can be affixed to the outside of the self-supporting server chassis.

In a further embodiment, stacks of self-supporting server chassis can comprise a base member with casters or other like transportation hardware that can facilitate transportation such a stack of self-supporting server chassis. Stacks of self-supporting server chassis can also comprise a top member that can provide further structural stability and rigidity, as well as providing cooling and airflow benefits, such as by providing airflow containment.

In a still further embodiment, a self-supporting server chassis can comprise racking hardware to accommodate computing devices and infrastructure hardware, including network switches, power supplies, terminal stations, and the like, that were designed for installation into a traditional information technology rack.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

The following description relates to a self-supporting server chassis, which can accept blade server computing devices, and other like computing devices and associated infrastructure hardware, and which can also provide structural support for vertical stacking of such self-supporting server chassis, thereby eliminating the need for conventional information technology racking hardware. A self-supporting server chassis can comprise internal support structures that can accept and provide physical support for the computing devices and other infrastructure hardware that can be installed in such a self-supporting server chassis. The self-supporting server chassis can comprise rails for accepting blade server computing devices, holes to provide for fan-assisted airflow, standoffs with screw holes or other like attachment members providing attachment support for fans, power supplies, backplanes and the like, and other like internal support structures. Additionally, a self-supporting server chassis can comprise vertical stacking support structures that can provide physical stability and rigidity for stacking multiple self-supporting server chassis in a vertical direction, as well as providing physical mechanisms by which such vertically stacked a self-supporting server chassis can be physically interconnected and interlocked for additional stability and rigidity. The vertical stacking support structures can be internal to the self-supporting server chassis, or they can be affixed to the outside of the self-supporting server chassis. Stacks of self-supporting server chassis can comprise a base member with casters or other like transportation hardware that can facilitate transportation such a stack of self-supporting server chassis. Stacks of self-supporting server chassis can also comprise a top member that can provide further structural stability and rigidity, as well as providing cooling and airflow benefits, such as by providing airflow containment. To more fully eliminate the need for conventional information technology racking hardware, the self-supporting server chassis can comprise racking hardware to accommodate computing devices and infrastructure hardware, including network switches, power supplies, terminal stations, and the like, that were designed for installation into a traditional information technology rack.

Figure 1:
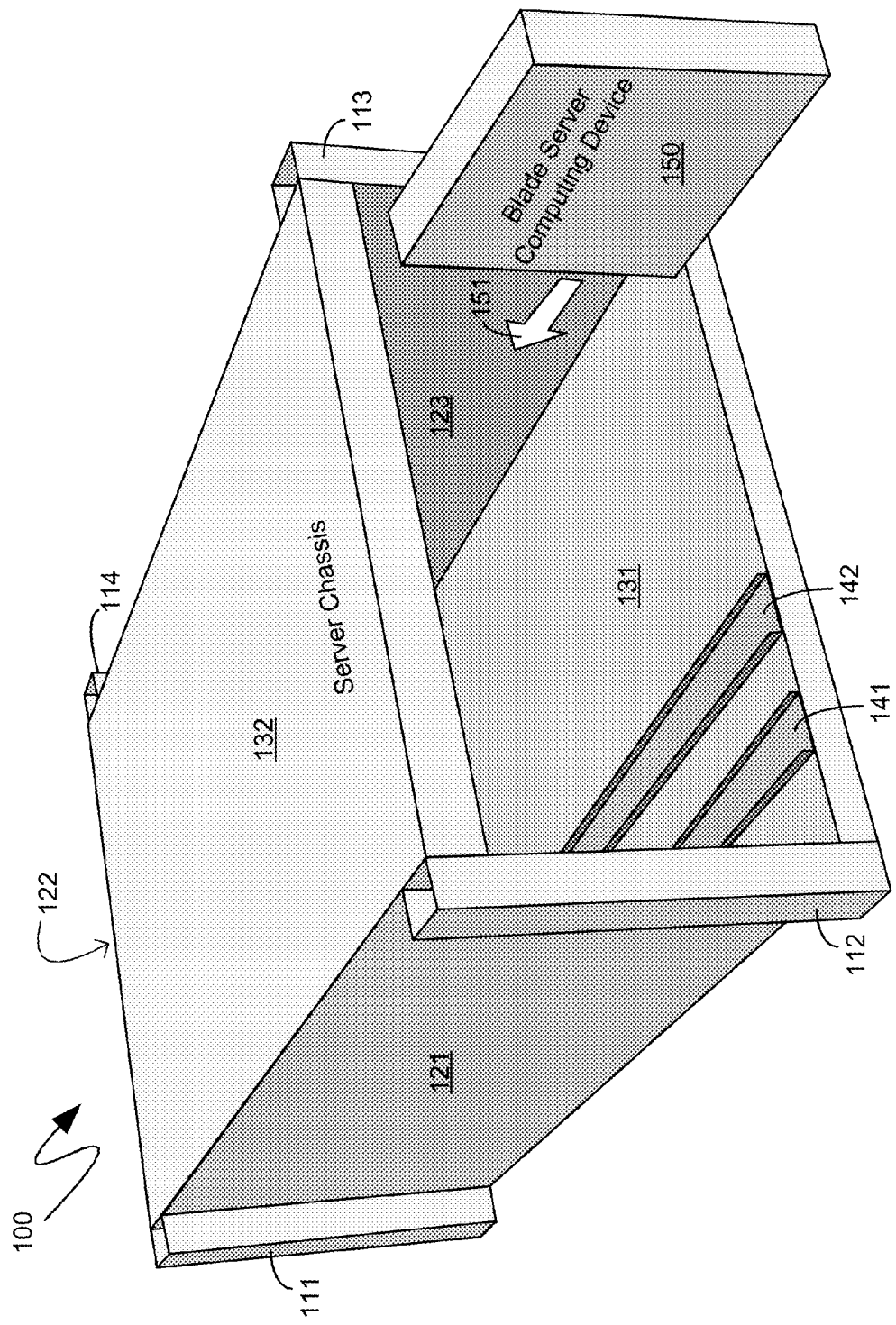
FIG. 1 is a diagram of an exemplary self-supporting server chassis.

Turning to FIG. 1, an exemplary self-supporting server chassis 100 is illustrated. As can be seen, in one embodiment, the exemplary self-supporting server chassis 100 comprises a base 131, sides 121 and 123, and a back 122. Additionally, as also illustrated in FIG. 1, the exemplary self-supporting server chassis 100 further comprises vertical stacking support structures 111, 112, 113 and 114. In one embodiment, the vertical stacking support structures of a self-supporting server chassis, such as the exemplary vertical stacking support structures 111, 112, 113 and 114, can be positioned at, or proximate to, the four corners of the base 131, such as in the manner illustrated in FIG. 1. In other embodiments, vertical stacking support structures can be positioned at any point along the sides 121 and 123, along the back 122, or combinations thereof. Additionally, while the exemplary self-supporting server chassis 100 shown in FIG. 1 comprises four vertical stacking support structures, namely the exemplary vertical stacking support structures 111, 112, 113 and 114, in other embodiments the self-supporting server chassis can comprise a larger or smaller quantity of vertical stacking support structures. For example, in one embodiment, a self-supporting server chassis could comprise as few as three vertical stacking support structures, namely with one vertical stacking support structure positioned along the side 121, a second vertical stacking support structure positioned along the side 123, and a third vertical stacking support structure positioned along the back 122. As another example, in another embodiment, a self-supporting server chassis could comprise the four exemplary vertical stacking support structures 111, 112, 113 and 114, with additional vertical stacking support structures positioned along the sides 121 and 123, along the back 122, or combinations thereof.

As illustrated in FIG. 1, in one embodiment, the vertical stacking support structures can be positioned on the outside of the self-supporting server chassis, such that the sides 121 and 123 are positioned between the vertical stacking support structures and components installed inside the self-supporting server chassis such as, for example, the exemplary blade server computing device 150 that is shown in FIG. 1. In other embodiments, however, the vertical stacking support structures can be positioned on the inside of self-supporting server chassis, such that components installed inside the self-supporting server chassis, such as the exemplary blade server computing device 150, are adjacent to such vertical stacking support structures, and the vertical stacking support structures are between components installed inside the self-supporting server chassis and the sides 121 and 123.

The vertical stacking support structures, such as the exemplary vertical stacking support structures 111, 112, 113 114 shown in FIG. 1, can be of a material exhibiting sufficient strength to support the self-supporting server chassis in a vertically stacked configuration, together with other such self-supporting server chassis. For example, the vertical stacking support structures can be metal, plastic, wood, or combinations thereof. In one preferred embodiment, the vertical stacking support structures can be made of steel. In another preferred embodiment, the vertical stacking support structures can be made of aluminum.

As illustrated in FIG. 1, in one embodiment, the vertical stacking support structures can be in the shape of a rectangular prism. In another embodiment, the vertical stacking support structures can be cylindrical in shape. In yet another embodiment, the vertical stacking support structures can be in the shape of a triangular prism. In still further embodiments, the vertical stacking support structures can be in the shape of any prism having at least three sides.

In the embodiment illustrated in FIG. 1, the vertical stacking support structures are illustrated as being hollow, with at least one opening extending throughout the vertical stacking support structure. In another embodiment, vertical stacking support structures can include a solid core, with hollow ends. In still other embodiments, vertical stacking support structures can be solid throughout all, or substantially all, of the length of such a vertical stacking support structure.

In addition to the base 131, the sides 121 and 123, the back 122 and vertical stacking support structures 111, 112, 113 and 114, a self-supporting server chassis, such the exemplary self-supporting server chassis 100 shown in FIG. 1, can further comprise a top 132. Such a top 132 can be optional in that, in embodiments where such a top 132 is optional, no internal componentry need physically attach to such a top 132. Consequently, while the top 132 can provide for additional structural stability, it can be optional in that components hosted by the self-supporting server chassis, such as, for example, the exemplary blade server computing device 150, that is shown in FIG. 1, need not physically be supported by the top 132.

As indicated previously, in one embodiment, a self-supporting server chassis, such as exemplary self-supporting server chassis 100, shown in FIG. 1, can comprise computing devices, such as blade server computing devices, network switch computing devices, storage computing devices, backplane communication computing devices and other like computing devices. Additionally, a self-supporting server chassis can further comprise infrastructure devices, such as power supplies, fans, temperature sensors, video cameras, motion detectors, locks, doors, gates, and other like infrastructure devices. In one embodiment, a self-supporting server chassis can comprise internal attachment support structures that can provide attachments support for any or all of the aforementioned computing devices and infrastructure devices. For example, the self-supporting server chassis can comprise rails for accepting blade server computing devices, such as the exemplary rails 141 and 142 that are shown in the exemplary self-supporting server chassis 100 of FIG. 1. More specifically, and as illustrated in FIG. 1, the base 131, of the exemplary self-supporting server chassis 100, can comprise rails, such as the exemplary rails 141 and 142, that can act as physical guides and supports for blade server computing devices, such as the exemplary blade server computing device 150, which can be inserted into the self-supporting server chassis, such as in the manner illustrated by the arrow 151. Alternatively, or in addition, the rails can be mounted on one or more of the sides 121 and 123, and the blade server computing device 150 could be inserted sideways from that illustrated in FIG. 1. The rails, such as the exemplary rails 141 or 142, can be physical protrusions, such as from the base 131, which can guide the insertion, such as of a blade server computing device, into the self-supporting server chassis. As such, the rails can guide the blade server computing device so that it aligns with appropriate other components in the self-supporting server chassis, such as, for example, a backplane or other like blade server computing device communicational connection that can be provided by the self-supporting server chassis.

Figure 2:
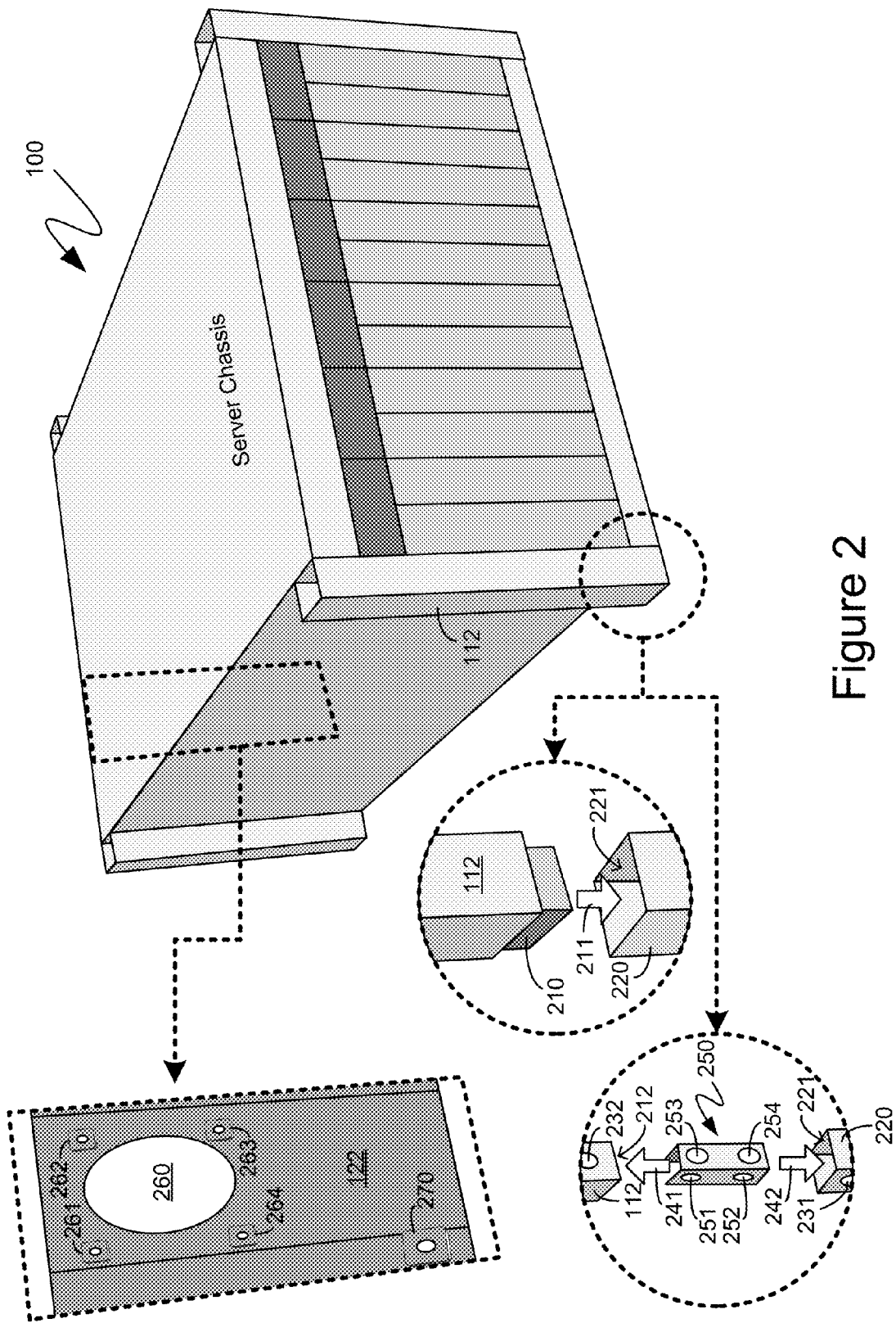
FIG. 2 is a diagram of another exemplary self-supporting server chassis.

Turning to FIG. 2, other internal attachment support structures are illustrated therein. For example, the exemplary self-supporting server chassis 100, now shown in FIG. 2, can comprise attachment support structures for a backplane, such as the exemplary attachment support structure 270. In one embodiment, the exemplary attachment support structure 270 can be a standoff that can comprise a screw hole. In such an embodiment, a backplane can attach to such an exemplary attachment support structure 270 by means of a screw and can be fastened down thereby. Furthermore, the standoff nature of the exemplary support structure 270 can ensure that the backplane attached to such an exemplary attachment support structure 270 is provided with clearance between it and the back 122 of the exemplary self-supporting server chassis 100.

As also shown in FIG. 2, the exemplary self-supporting server chassis 100 can comprise attachment support for one or more fans that can act to cool the self-supporting server chassis 100 and the various computing devices and infrastructure devices installed therein. For example, attachment support for a fan can include a hole, such as the exemplary hole 260, through which fan-assisted airflow can pass. Additionally, attachment support for a fan can include one or more attachments support structures, such as the attachment support structures 261, 262, 263 and 264. In one embodiment, the exemplary attachment support structures 261, 262, 263 and 264 can be standoffs that can each comprise a screw hole. In such an embodiment, a fan can attach to such exemplary attachment support structures 261, 262, 263 and 264 by means of screws and can be fastened down thereby.

Although not specifically illustrated, analogous attachment supports to those described above can be provided for various other computing devices and infrastructure devices that can be installed in the self-supporting server chassis 100. For example, the self-supporting server chassis 100 can include one or more power supplies, video cameras, motion sensors, locks, gates, doors and other like infrastructure devices.

As indicated previously, the self-supporting server chassis can be designed so as to facilitate vertical stacking of one such self-supporting server chassis on top of another one. The vertical stacking support structures of the self-supporting server chassis can interlock with one another to provide stability and rigidity in vertical stacks of self-supporting server chassis. Additionally, a vertical stacking support structure can comprise protrusions or connections that can affix a vertical stacking support structure of one self-supporting server chassis to a corresponding vertical stacking support structure of another, different self-supporting server chassis that is vertically stacked thereupon. For example, and as illustrated in FIG. 2, in one embodiment, vertical stacking support structures, such as the exemplary vertical stacking support structure 112, can comprise protrusions, such as the exemplary protrusion 210. Furthermore, vertical stacking support structures, such as the exemplary vertical stacking support structure 220, can comprise, on an end opposite the end having the protrusion 210, an opening 221 into which of the protrusion 210 of another vertical stacking support structure 112 can mate. Thus, for example, as illustrated in FIG. 2 by the arrow 211, the protrusion 210 of the exemplary vertical stacking support structure 112 can be physically inserted into the opening 221 of another exemplary vertical stacking support structure 220. In such a manner, vertical stacking of self-supporting server chassis can be achieved. More specifically, in the illustrated example, a self-supporting server chassis associated with the vertical stacking support structure 112 could be stacked on top of a self-supporting server chassis associated with the vertical stacking support structure 220, and such a vertical stacking could be facilitated and reinforced by the insertion of the protrusion 210 of the vertical stacking support structure 112 into the opening 221 of the vertical stacking support structure 220.

In one embodiment, where a vertical stacking support structure comprises a protrusion, such an exemplary protrusion 210, the protrusion can be made of a material that can facilitate utilization of the protrusion as a support on level ground, irrespective of any stacking Thus, for example, in such an embodiment, a protrusion, such as exemplary protrusion 210, can be made of a plastic or rubber material. In other embodiments, the protrusion, such as the exemplary protrusion 210, can be made of the same material as the corresponding vertical stacking support structure, such as exemplary vertical stacking support structure 112.

In another embodiment, rather than one vertical stacking support structure comprising a protrusion on one end and a corresponding vertical stacking support structure comprising an opening on a mating end, each vertical stacking support structure can comprise structure sufficient to enable the vertical stacking support structures to interlock with one another to provide stability and rigidity in vertical stacking arrangements. For example, each vertical stacking support structure can comprise one half of an interlocking protrusion system such that the protrusion of one vertical stacking support structure interlocks with the protrusion of a corresponding vertical stacking support structure. As another example, the vertical stacking support structures themselves can comprise a shape or structure that interlocks with the shape or structure of a corresponding vertical stacking support structure. The interlocking abilities of two corresponding vertical stacking support structures can be enhanced or reinforced by additional connecting hardware, such as screws, rivets, brackets, clamps, pins and other like connecting hardware.

In yet another embodiment, a connector, such as the exemplary connector 250, can be utilized to facilitate vertical stacking of multiple ones of the self-supporting server chassis. More specifically, self-supporting server chassis, such as the exemplary self-supporting server chassis 100 shown in FIG. 2, can comprise vertical stacking support structures, such as the exemplary vertical stacking support structure 112, that can comprise openings, such as a hole, indentation, or other like opening, or can simply be hollow throughout the vertical stacking support structure. For example, FIG. 2 illustrates an exemplary vertical stacking support structure 112, having an opening 212, and another exemplary vertical stacking support structure 220, having an opening 221. Furthermore, the vertical stacking support structures can comprise attachment supports, such as in the form of screw holes, pin holes, rivet holes and other like attachment supports. For example, FIG. 2 illustrates an exemplary vertical stacking support structure 112, having a screw hole 232, and another exemplary vertical stacking support structure 220, having a screw hole 231.

In such an embodiment, a connector, such as exemplary connector 250, can be sized to fit into the openings of the vertical stacking support structures, such as the exemplary openings 212 and 221 that are shown in FIG. 2. The connector 250 can be of a compatible shape to facilitate its insertion into the openings of the vertical stacking support structures. For example, if the vertical stacking support structures were in the form of a rectangular prism, then the connector 250 can also be in the form of a rectangular prism, having slightly smaller dimensions to facilitate its insertion into the openings of the vertical stacking support structures. Similarly, as another example, if the vertical stacking support structures were a cylindrical shape, then the connector 250 could, likewise, have a cylindrical shape, except with a slightly smaller diameter to facilitate insertion of the openings in the vertical stacking support structures. Furthermore, connector can be hollow, such as the exemplary connector 250 shown in FIG. 2, or it can be solid throughout its shape.

A connector, such as the exemplary connector 250, need not be a closed object. For example, the exemplary connector 250 is illustrated in FIG. 2 as comprising only three sides. In one embodiment, connectors with only two sides, such as an L-shaped connector, can equally be utilized. Connectors in the form of a flat bar can, likewise, utilized.

The connector can comprise attachment supports that can be compatible with, and can align with, the attachment supports of the vertical stacking support structures into which such a connector is being inserted. For example, the exemplary connector 250 is illustrated in FIG. 2 as comprising screw holes 251, 252, 253 and 254. When inserted into the vertical stacking support structures 212 and 220, such as is illustrated by the arrows 241 and 242, the connector 250 can be positioned so that at least some of the screw holes 251, 252, 253 and 254 align with the screw holes in the vertical stacking support structures 212 and 220. For example, the screw hole 253, of the connector 250, can align with the screw hole 232 of the vertical stacking support structure 212, and, similarly, the screw hole 252, of the connector 250, can align with the screw hole 231, of the vertical stacking support structure 220. A screw inserted through the screw holes 253 and 232 can fasten the connector 250 to the vertical stacking support structure 212, and, similarly, a screw inserted through the screw holes 252 and 231 can fasten the connector 250 to the vertical stacking support structure 220. In such a manner, by fastening the vertical stacking support structures 212 and 220 to the connector 250 and, thus, to each other, self-supporting server chassis, such as those to which the exemplary vertical stacking support structures 212 and 220 belong, can be vertically stacked one on top of another and can be affixed so as to provide stability and rigidity. Other types of attachment supports, such as, pin holes, rivet holes and other like attachment supports, can equally be utilized by a connector to fasten vertical stacking support structures to itself and, thus, to each other.

As in the case of the protrusions described above, in one embodiment, the above-described connector, rather than inserting into openings on both vertical stacking support structures, can, instead, be shaped to interlock with the vertical stacking support structures to provide stability and support. For example, each vertical stacking support structure can be of a shape that a connector can interlock with. As another example, the shape of the connector itself can interlock with the vertical stacking support structures through, for example, adjustable mechanisms. As yet another example, the interlocking abilities of a vertical stacking support structure and the connector can be enhanced or reinforced by additional connecting hardware, such as screws, rivets, brackets, clamps, pins and other like connecting hardware.

Figure 3:
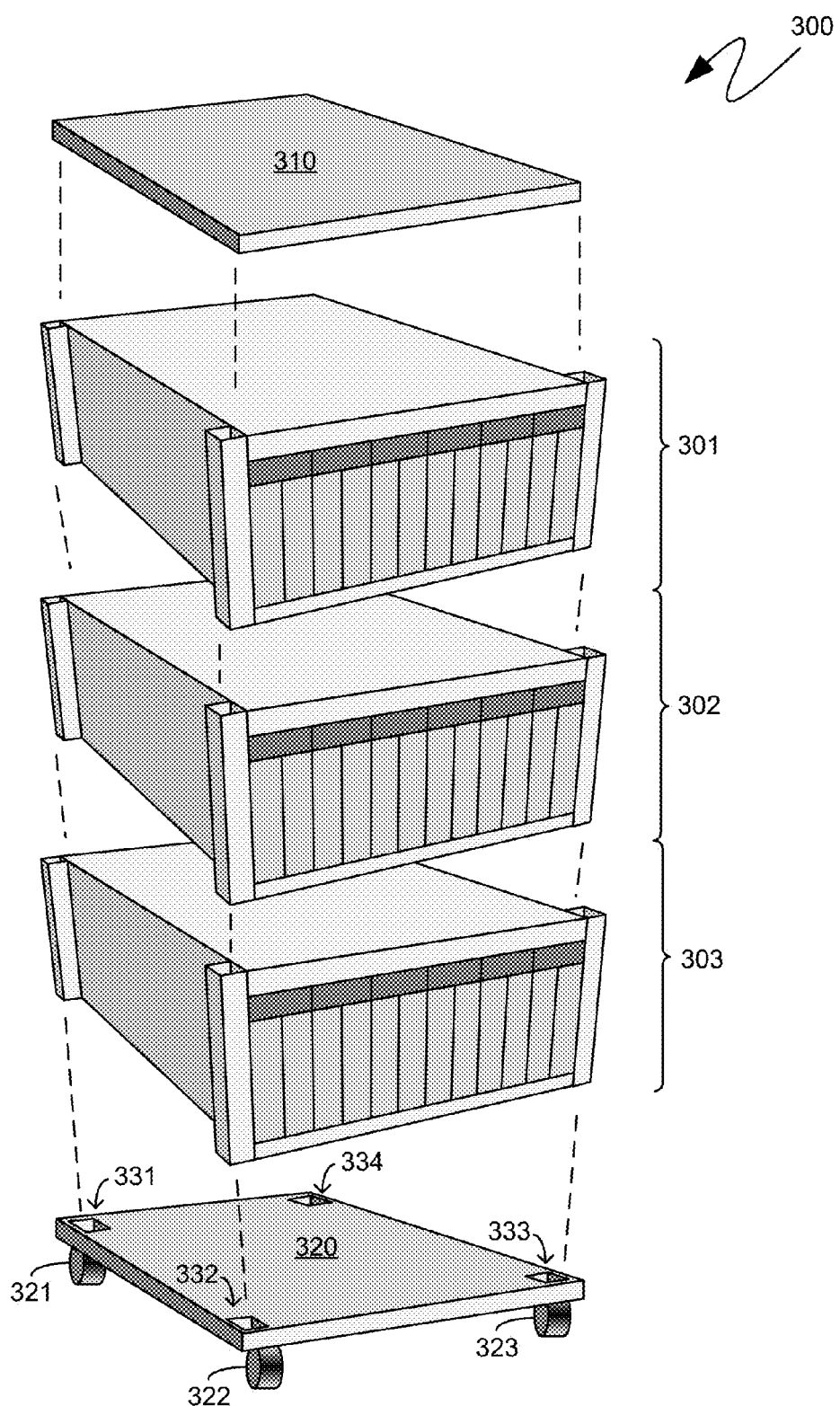
FIG. 3 is a diagram of a stack of self-supporting server chassis.

Turning to FIG. 3, the system 300 shown therein illustrates an exemplary vertical stacking of three self-supporting server chassis, namely the exemplary self-supporting server chassis 301, 302 and 303. Such a vertical stacking of self-supporting server chassis can include as few as two self-supporting server chassis or as many as the height of whatever room such a stack is placed in allows. More specifically, because the self-supporting server chassis do not require an independent rack, the height of a stack of such self-supporting server chassis can be variable and can be adjusted by increasing or decreasing number of self-supporting server chassis that are vertically stacked one on top of the other.

To provide for ease-of-use and convenience, a stack of self-supporting server chassis can be supported by a base, such as the exemplary base 320, which can comprise wheels, casters, or other like transportation hardware, to enable the stack of self-supporting server chassis to be moved more easily. For example, the exemplary base 320 that is shown in FIG. 3 is illustrated as comprising casters 321, 322 and 323. In one embodiment, a base, such as the exemplary base 320, can further comprise openings, such as the exemplary openings 331, 332, 333 and 334 in order to facilitate an attachment connection between the base and the vertical stacking support structures of the self-supporting server chassis positioned on top of such a base. As indicated previously, such a connection can be via protrusions extending from the vertical stacking support structures of the self-supporting server chassis, via connectors positioned between the base and the vertical stacking support structures of the self-supporting server chassis, or via combinations thereof. In other embodiments, a base, such as the exemplary base 320, can comprise members that can interlock with corresponding members, either on the vertical stacking support structures or that are part of the connectors connecting the vertical stacking support structures to the base.

In one embodiment, a stack of self-supporting server chassis, such as that illustrated by the exemplary system 300 of FIG. 3, can further comprise a top, such as the exemplary top 310, that can add further structure and rigidity to the self-supporting server chassis stack. For example, as described above, in one embodiment, self-supporting server chassis can lack a cross-member across the front of such self-supporting server chassis, other than the base of the self-supporting server chassis itself. In such an embodiment, a top, such as the exemplary top 310, can provide rigidity and stability, especially to the topmost self-supporting server chassis in a stack, because such a top can positionally affix, with respect to one another, the vertical stacking support structures of the topmost self-supporting server chassis. Additionally, a top, such as the exemplary top 310, can provide airflow containment to more effectively cool computing devices in the stack of self-supporting server chassis, such as that illustrated by the exemplary system 300 of FIG. 3. As with the base of the self-supporting server chassis stack, the top, such as the exemplary top 310, can comprise protrusions, connectors, openings for connectors, interlocking members or openings, or other like mechanisms to facilitate an attachment connection between the top and the vertical support members of the topmost self-supporting server chassis.

Because the self-supporting server chassis act as their own rack, and are affixed to one another in a vertical stacking arrangement, it can be difficult to remove a central one of the self-supporting server chassis in such a rack. However, in one embodiment, and as described in detail above, a self-supporting server chassis can comprise only non-computing hardware, such as vertical support members, sides, back and, optionally, a top, internal support structures, such as rails, holes for air flow, stand-offs, and other like internal support structures. The remaining computing and infrastructure devices can be wholly removable from the self-supporting server chassis, such that any component that is likely to fail is replaceable without requiring the self-supporting server chassis hosting such a component to be physically removed from a vertical stack of such self-supporting server chassis.

Additionally, because the self-supporting server chassis act as their own rack, they are not limited by standardized widths. More specifically, the width of a self-supporting server chassis and, indeed, any dimension of a self-supporting server chassis, can be selected based upon the components to be installed therein including, for example, blade server computing devices and other like computing devices and computing components, and infrastructure hardware and components.

Figure 4:
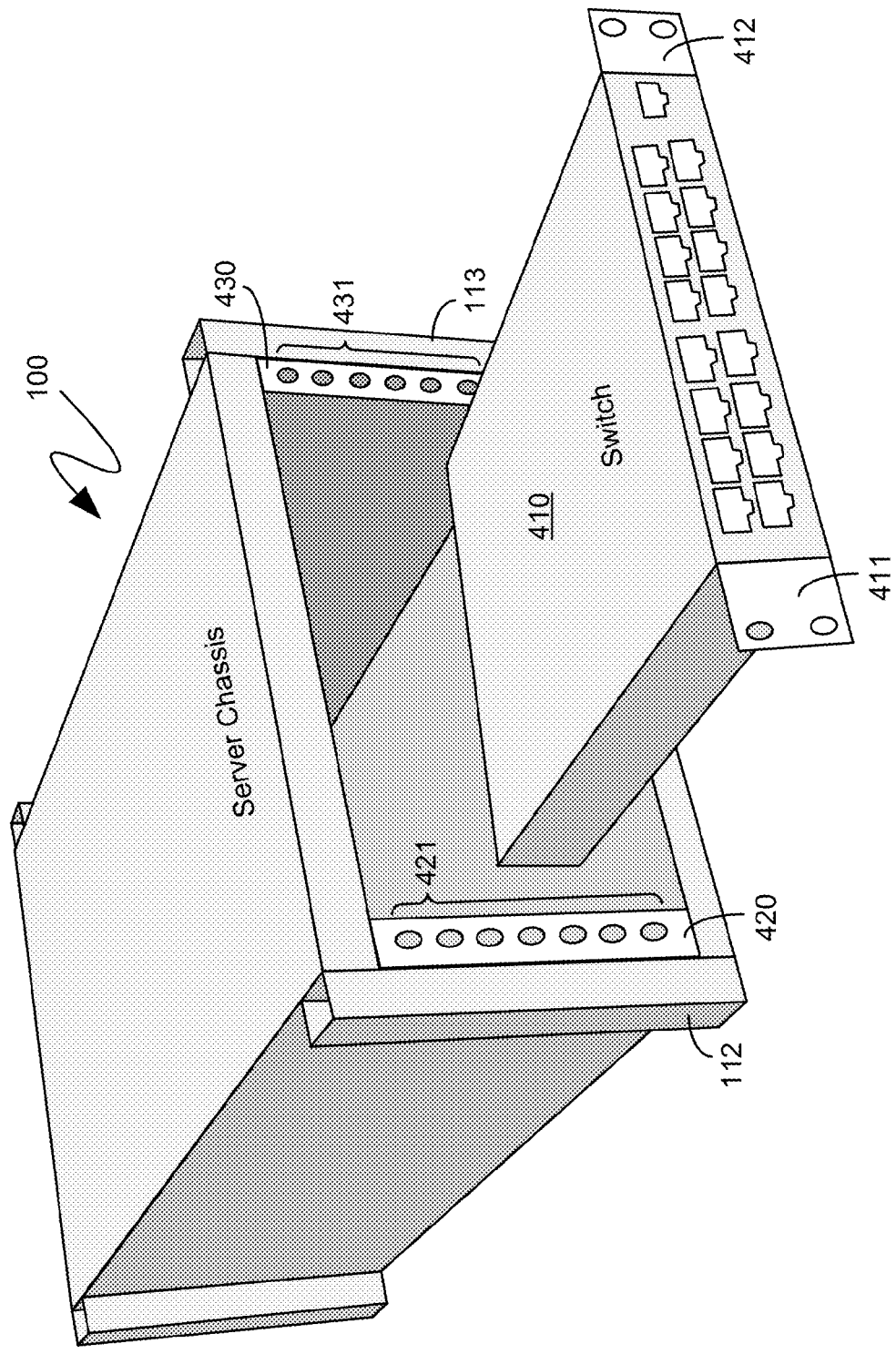
FIG. 4 is a diagram of an exemplary self-supporting server chassis with racking hardware.

Turning to FIG. 4, in one embodiment, a self-supporting server chassis, such as the exemplary self-supporting server chassis 100, now shown in FIG. 4, and described in detail above, can comprise a standard rack attachment support structure that can provide physical support and facilitate attachment, into the self-supporting server chassis, of one or more devices that were designed to be installed on a conventional information technology rack. For purposes of illustration, FIG. 4 includes an exemplary switch 410 that can comprise rack mounting ears 411 and 412. As illustrated in FIG. 4, and as will be recognized by those skilled in the art, the rack mounting ears 411 and 412 can comprise attachment supports, such as in the form of screw holes or bolt holes, to facilitate attachment of the exemplary switch 410 onto a conventional information technology rack.

Consequently, in one embodiment, to facilitate attachment of the exemplary switch 410 into the exemplary self-supporting server chassis 100, the self-supporting server chassis can comprise conventional information technology rack rails, such as the exemplary rack rails 420 and 430, which can comprise attachments supports in the form of the holes 421 and 431. The holes 421 and 431 can be spaced in accordance with standard information technology racking design and, as such, can be compatible with the holes in the rack mounting ears 411 and 412 of the exemplary switch 410. Consequently, an attachment device, such as a screw, can attach the rack mounting ears 411 and 412 to the rack rails 420 and 430, thereby enabling the exemplary switch 410 to be installed into a self-supporting server chassis, such as the exemplary self-supporting server chassis 100. Vertical stacks of self-supporting server chassis can, thereby, include legacy hardware while still eliminating the need for traditional information technology racks.

Although the rack rails 420 and 430 were illustrated, in FIG. 4, as being an additional part of the exemplary self-supporting server chassis 100, in other embodiments, existing components of a self-supporting server chassis can serve dual functionality that includes rack rail functionality. For example, the vertical stacking support structures, such as the exemplary vertical stacking support structures 112 and 113, shown in FIG. 4, can have the holes 421 and 431 drilled into them and, thereby, can act as both vertical stacking support structures and as rack rails. In such an embodiment, the functionality provided by the rack rails 420 and 430 would, instead, be provided by the exemplary vertical stacking support structures 112 and 113 and, as such, the rack rails 420 and 430, as separate components, would not be necessary.

As can be seen from the above descriptions, a self-supporting server chassis been described. Which, in view of the many possible variations of the subject matter described herein, we claim as our invention all such embodiments as may come within the scope of the following claims and equivalents thereto.

I claim:

1. A self-supporting server chassis comprising:
   a base;
   a first side adjacent the base;
   a second side adjacent the base and opposite the first side;
   a back adjacent the base and the first and second sides;
   a first internal support structure configured to support a backplane into which two or more server computing devices are plugged;
   a second internal support structure configured to support the two or more server computing devices; and
   at least three vertical stacking support structures positioned, in aggregate, on at least one of: the base, the first side, the second side and the back, the at least three vertical stacking support structures comprising:
   a first vertical stacking support structure on a first edge of the first side at a front of the self-supporting server chassis; and
   a second vertical stacking support structure on a first edge of the second side at the front of the self-supporting server chassis;
   wherein both the first and second vertical stacking support structures comprise multiple attachment openings spaced apart a predetermined distance and alienable with openings in rack mounting ears affixed to rack mountable computing devices.

2. The self-supporting server chassis of claim 1, wherein the at least three vertical stacking support structures further comprise:
   a third vertical stacking support structure on a second edge of the first side; and
   a fourth vertical stacking support structure on a second edge of the second side;
   wherein each of the first, second, third and fourth vertical stacking support structures are external to the self-supporting server chassis and are oriented orthogonally to the base.

3. The self-supporting server chassis of claim 1, wherein the at least three vertical stacking support structures are rectangular prisms.

4. The self-supporting server chassis of claim 1, wherein the at least three vertical stacking support structures each comprise a hollow opening at a top and a bottom of the at least three vertical stacking support structures.

5. The self-supporting server chassis of claim 1, wherein the at least three vertical stacking support structures each comprise a hollow opening at a top of the at least three vertical stacking support structures and a protrusion at a bottom of the at least three vertical stacking support structures, the protrusion sized smaller than the hollow opening at the top of the at least three vertical stacking support structures.

6. The self-supporting server chassis of claim 1, wherein the at least three vertical stacking support structures each comprise a first interlocking member at a top of the at least three vertical stacking support structures and a corresponding interlocking member at a bottom of the at least three vertical stacking support structures.

7. The self-supporting server chassis of claim 1, further comprising a top opposite the base and adjacent the back and the first and second sides.

8. The self-supporting server chassis of claim 1, wherein the server computing devices are blade server computing devices; and wherein further the second internal support structure comprises two or more rails along which the blade server computing devices slide as they are inserted into the self-supporting server chassis.

9. The self-supporting server chassis of claim 1, wherein the first internal support structure comprises at least three stand-offs extending from the back and having holes through which fasteners, attaching the backplane to the self-supporting server chassis, are insertable.

10. The self-supporting server chassis of claim 1, further comprising the two or more server computing devices, wherein the two or more server computing devices are physically inside the self-supporting server chassis.

11. The self-supporting server chassis of claim 1, further comprising:
 a first standard rack attachment support member along the first side at a front of the self-supporting server chassis; and
 a second standard rack attachment support member along the second side at the front of the self-supporting server chassis;
 wherein both the first and second standard rack attachment support members comprise multiple attachment support openings spaced apart a predetermined distance and alignable with openings in rack mounting ears affixed to rack mountable computing devices.

12. A system comprising:
 a first self-supporting server chassis, the first self-supporting chassis comprising:
  a base;
  a first side adjacent the base;
  a second side adjacent the base and opposite the first side;
  a back adjacent the base and the first and second sides;
  a first internal support structure configured to support a backplane into which two or more server computing devices are plugged;
  a second internal support structure configured to support the two or more server computing devices; and
  at least three vertical stacking support structures positioned, in aggregate, on at least one of: the base, the first side, the second side and the back;
 a second self-supporting server chassis comprising at least three other vertical stacking support structures; and
 connectors between each of the at least three vertical stacking support structures of the first self-supporting server chassis and corresponding ones of the at least three other vertical stacking support structures of the second self-supporting server chassis;
 wherein the at least three vertical stacking support structures of the first self-supporting server chassis and the at least three other vertical stacking support structures of the second self-supporting server chassis comprise first interlocking members; and wherein further the connectors comprise second interlocking members that interlock with the first interlocking members.

13. The system of claim 12, wherein both the at least three vertical stacking support structures of the first self-supporting server chassis and the at least three other vertical stacking support structures of the second self-supporting server chassis comprise hollow ends; and wherein further the connectors are positioned such that each connector is partially inserted into a hollow end of a one of the at least three vertical stacking support structures of the first self-supporting server chassis and also partially inserted into a hollow end of a one of the at least three other vertical stacking support structures of the second self-supporting server chassis.

14. The system of claim 13, the at least three vertical stacking support structures of the first self-supporting server chassis and the at least three other vertical stacking support structures of the second self-supporting server chassis are of a first shape and the connectors are of a second shape differing from the first shape, the first shape being a rectangular prism.

15. The system of claim 12, further comprising:
 a stack bottom of a stack comprising the first self-supporting server chassis and the second self-supporting server chassis, the stack bottom comprising at least three openings on a first side; and
 additional connectors connecting the stack bottom to a lower one of the first self-supporting server chassis or the second self-supporting server chassis, the additional connectors being positioned such that each connector is partially inserted into one of the at least three openings and a hollow end of a corresponding one of either the at least three vertical stacking support structures of the first self-supporting server chassis or the at least three other vertical stacking support structures of the second self-supporting server chassis, whichever of the first or second self-supporting server chassis is the lower one.

16. The system of claim 15, wherein the stack bottom further comprises wheels on a second side opposite the first side.

17. The system of claim 12, wherein the both the first self-supporting server chassis and the second self-supporting server chassis each comprise a top opposite the base and adjacent the back and the first and second sides.

18. The system of claim 12, wherein the at least three vertical stacking support structures each comprise a hollow opening at a top and a bottom of the at least three vertical stacking support structures.

19. The system of claim 12, wherein the server computing devices are blade server computing devices; and wherein further the second internal support structure comprises two or more rails along which the blade server computing devices slide as they are inserted into the self-supporting server chassis.

20. A self-supporting server chassis comprising:
 two or more server computing devices;
 a power supply; and
 at least three vertical stacking support structures connectable to at least three other vertical stacking support structures of another self-supporting server chassis positioned either above or below the self-supporting server chassis, the at least three vertical stacking support structures comprising:
a first vertical stacking support structure on a first edge of the first side at a front of the self-supporting server chassis; and
a second vertical stacking support structure on a first edge of the second side at the front of the self-supporting server chassis;
wherein both the first and second vertical stacking support structures comprise multiple attachment openings spaced apart a predetermined distance and alignable with openings in rack mounting ears affixed to rack mountable computing devices.

* * * * *